United States Patent [19]

Martin

[11] Patent Number: 5,072,190

[45] Date of Patent: Dec. 10, 1991

[54] PRESSURE SENSING DEVICE HAVING FILL FLUID CONTAMINATION DETECTOR

[75] Inventor: John R. Martin, Foxboro, Mass.

[73] Assignee: The Foxboro Company, Foxboro, Mass.

[21] Appl. No.: 567,411

[22] Filed: Aug. 14, 1990

[51] Int. Cl.[5] .................... G01R 27/22; G01R 27/26
[52] U.S. Cl. .................................. 324/663; 324/690; 324/693; 73/715; 73/727
[58] Field of Search ............... 324/446, 663, 686, 687, 324/690, 693, 698, 717, 724, 683; 73/861.24, 721, 715, 726, 727, 724

[56] References Cited

U.S. PATENT DOCUMENTS

| 3,943,557 | 3/1976 | Frazee et al. | 357/75 |
|---|---|---|---|
| 3,948,098 | 4/1976 | Richardson et al. | 73/861.2 |
| 4,030,028 | 6/1977 | Allender | 324/698 |
| 4,224,565 | 9/1980 | Sosniak et al. | 324/687 X |
| 4,287,501 | 9/1981 | Tominaga et al. | 338/42 |
| 4,314,225 | 2/1982 | Tominaga et al. | 338/4 |
| 4,411,741 | 10/1983 | Janata | 204/1 T |
| 4,420,722 | 12/1983 | Todd | 324/158 R |
| 4,465,075 | 8/1984 | Swartz | 128/672 |
| 4,626,774 | 12/1986 | Regtien | 324/683 |
| 4,646,070 | 2/1987 | Yasuhara et al. | 324/690 X |
| 4,798,093 | 1/1989 | Kenoun | 73/708 |
| 4,854,177 | 8/1989 | Phipps | 73/861.24 |

Primary Examiner—Jack B. Harvey
Attorney, Agent, or Firm—Lahive & Cockfield

[57] ABSTRACT

A monitoring system for testing the integrity of seal structures, filled with an electrically non-conductive fluid and for validating measurements of a measurement device. The monitoring system includes electrodes disposed in the fluid for measuring an electrical property of the fluid. The system indicates when the measured electrical property changes, which indicates contamination of the fluid.

5 Claims, 2 Drawing Sheets

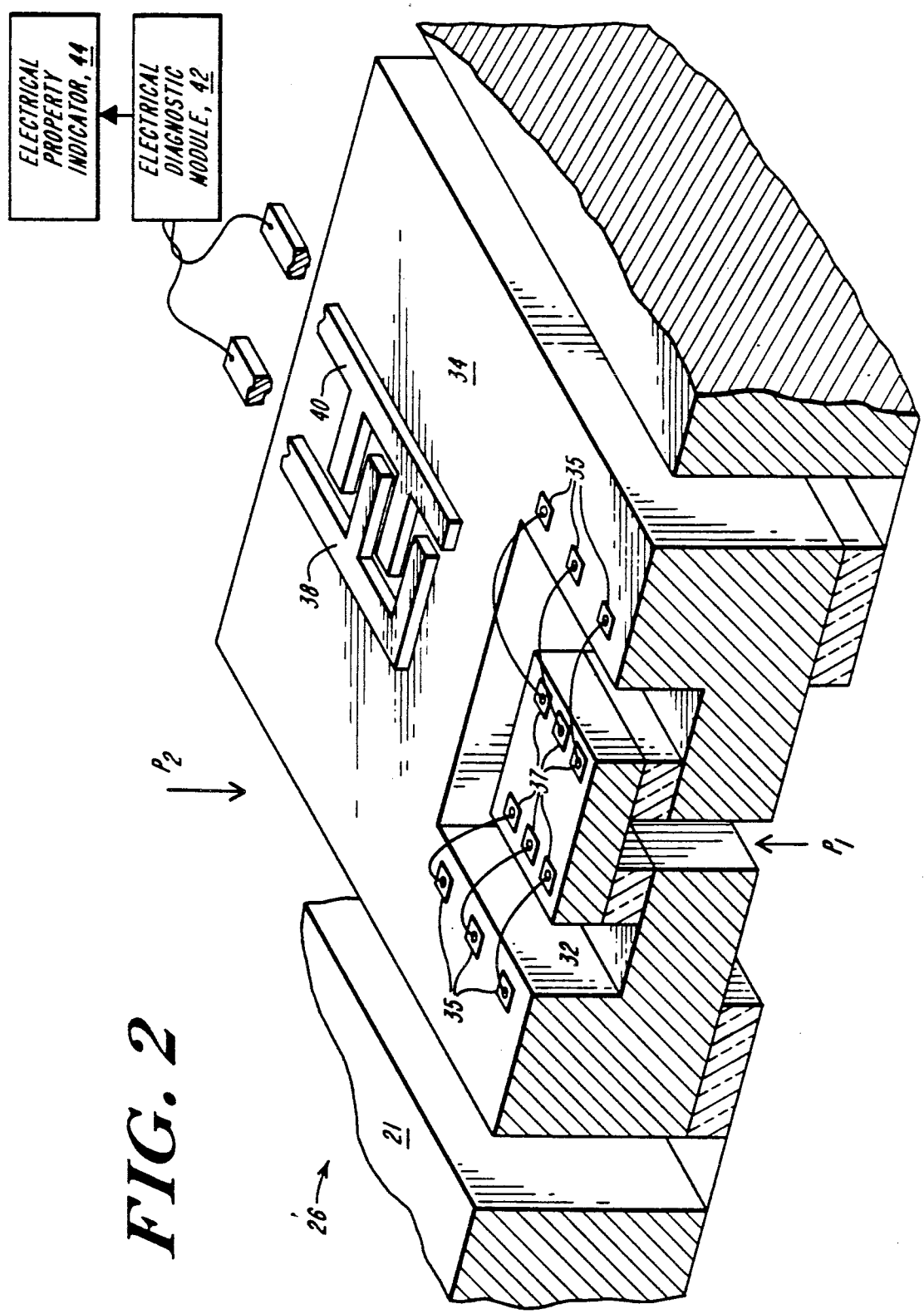

PRESSURE SENSING DEVICE HAVING FILL FLUID CONTAMINATION DETECTOR

The present invention relates to a measurement validation system for sealed enclosures used to protect pressure sensors and transmitters.

BACKGROUND

Sealed enclosures filled with fill fluid are needed to protect measurement devices, such as pressure transmitters or the sensors in vortex-shedding meters, from aggressive environments. See, for example, the transmitter shown and described in U.S. Pat. No. 3,948,098 to Richardson et al. As described in the Richardson et al. patent, these devices typically include process isolation diaphragms which fluctuate in response to alternating pressure variations generated by a shedder placed in a stream of process fluid. Pressure applied to the diaphragms is propagated to a pressure sensing device such as a piezoelectric bimorph device sealed and protected from the process fluid via an electrically non-conductive hydraulic fill fluid. The frequency of pressure detected by the sensor is then measured to determine the mean flow velocity.

For such sensing devices, the measurement accuracy is critically dependant on the ability of a mechanically compliant structure to transmit pressure while, at the same time, protecting the sensing device from the aggressive process fluids. If fill fluid becomes contaminated, which can result from a breach of the isolation diaphragm, the accuracy of the measurements of the sensor will be significantly affected. Relying on these false readings can result in drastic consequences for a measured process.

SUMMARY OF THE INVENTION

The present invention provides a solution to the problem of detecting impending failure in pressure transmitters and sensors which occur when the seal structure that protects the sensing element is penetrated due to corrosion, fatigue, cracks, etc. It also provides an in-process monitoring technique for controlling the quality of the sensor assemblies during manufacture. These results are achieved by monitoring the fill fluid used to transmit pressure variations from the isolation diaphragms to a sensor. Contamination of this fill fluid can result from a rupture of the sealed environment used to protect the sensor from process fluids or from contaminants introduced by improper cleaning of the sensor assembly components. In some instances, the monitor can also detect long-term chemical breakdown of the fill fluid. This invention can also be extended to other devices which rely on the integrity of a fluid within a sealed environment.

According to the preferred embodiment, a measuring device is equipped with a monitoring system that includes two electrically conductive electrodes disposed within a sealed cavity, having a hydraulic fill fluid used to transmit pressure from a process environment to a sensor. The electrodes are spaced to allow fill fluid to reside therebetween for measuring changes in its electrical properties. Depending on the electrical characteristics of the fill fluid and the likely contaminants, resistivity or conductivity of the fill fluid is measured by electronic means connected to the electrodes. Changes in the properties of the fluid may indicate that it is contaminated and that a breach in the sealed cavity has occurred. An alarm, connected to the electronic means, alerts a user when these changes occur.

It is therefore an object of the invention to provide a measurement validation system for a sealed enclosure which protects pressure sensors and transmitters.

It is a further object of this invention to measure changes in electrical characteristics of fill fluid in a sealed enclosure to detect fluid contamination that will cause unreliable measurements.

BRIEF DESCRIPTION OF THE DRAWINGS

The foregoing and other objects, features and advantages of the invention will be apparent from the following more particular description of the preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 2 is a schematic diagram of the sensor of FIG. 1, partially in block form, having electrodes mounted to a sensor package for detecting changes in the electrical characteristics of the fill fluid.

DETAILED DESCRIPTION OF THE PREFERRED EMBODIMENT

Figure 1:
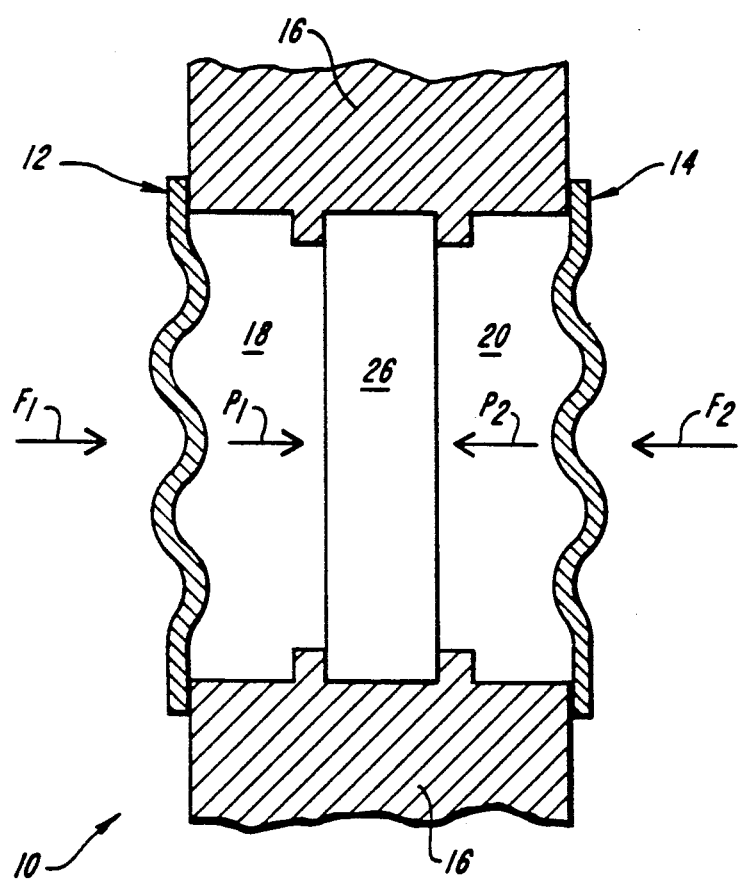
FIG. 1 is a schematic diagram of a measurement device having fill fluid sealed within two separate cavities for transmitting pressure, generated by flexible diaphragms responding to external pressure variations, to opposite sides of a sensor.

The present invention is a measurement validation system which monitors fluids in a sealed environment of a measuring device. Validation is particularly important for measuring devices such as pressure transmitters or sensors used in vortex shedding flowmeters. These devices employ a hydraulic fill fluid for propagating pressure applied to at least one side of the measuring device to a sensor protected within the housing of the device. If the characteristics of the fill fluid change, the accuracy of the transmitter is significantly affected. More specifically, if the protective seal, which is commonly referred to as the isolation diaphragm, is breached, the sensor is likely to be substantially degraded shortly thereafter. Thus the monitor system of this invention provides a warning of impending failure. For this reason, the concepts of this invention are described with reference to a conventional differential pressure transmitter. It should become clear to one skilled in the art, in view of the following detailed description, that this concept can be applied to other types of pressure transmitters, sensors or sealed environments having non-conducting fluids.

Referring now to FIG. 1, measuring device 10 includes two sealout diaphragm 12 and 14 secured over openings of a sensor housing 16 to form two sealed cavities 18 and 20. Each cavity is filled with a non-conductive fill fluid. A differential pressure sensor 26 is disposed between and in fluid communication with both cavities 18 and 20. Note that sensor 26 can be placed remotely from the sealed cavities to protect it from high temperature processes. Further, the present invention is not limited to sensors with two sealed cavities. In some applications, such as pressure transmitters, only one cavity is needed.

Diaphragms 12 and 14 are adapted to receive external pressure variations $F_1$ and $F_2$, generated from vortices shed from a vortex plate or the like placed in a flowing process fluid or static pressure changes. External pressure variations $F_1$ and $F_2$ may also result from mechanical vibration. Diaphragms 12 and 14 are made to be flexible to respond to these pressure variations $F_1$ and $F_2$ for generating and transmitting pressures $P_1$ and $P_2$ to opposite sides of the sensor 26 via fill fluid in each cavity 18 and 20. For these applications, the fill fluid typically consists of an incompressible fluid such as oil. These diaphragms are typically formed from flexible, thin metal plates designed to withstand fatigue resulting from pressure fluctuations and vibrations.

A failure of a transmitter can occur in one of several ways. The most common types of failures occur when the welds (not shown) securing the thin metal diaphragms 12 and 14 to the housing 16 crack or when holes are formed in the diaphragms as a result of corrosion. Process fluid entering the sealed environment and mixing with the fill fluid will drastically change its operating and electrical characteristics. Failure can also occur when the fill fluid, over time, chemically breaks down as a result of being exposed to extreme temperatures of the process fluid. Since the contamination of the fill fluid under these failure conditions is often gradual, resulting inaccurate measurements can go unnoticed. According to the present invention, false measurements are prevented by equipping the transmitter with a monitoring system for testing the integrity of the fill fluid and validating the sensor measurements.

In the preferred embodiment, the monitoring system includes a pair of electrodes 38 and 40 (FIG. 2) formed on each side of a sensor package 34 and in fluid communication with fill fluid in each cavity 18 and 20. Note that for clarity only one pair of electrodes 38 and 40 is shown in FIG. 2.

The location of the electrodes is not critical. Placing the electrodes on each side of the sensor package 34 is preferred, however, because the sensor package 34 would typically be fabricated using an insulating substrate such as ceramic, and include electrical pads 35 that are interconnected to pads 37 of the sensor element 32, commonly by wire-bonding techniques. Thus, economically it is attractive to add a few more leads to the package 34 for the monitoring system when it is fabricated. The electrodes 38 and 40 can be formed or deposited on each side of the sensor package by using any commercially suitable means such as plating, thin-film metallization or thick-film technologies. The electrodes 38 and 40 are conveniently deposited on the substrate such that an interdigitated finger circuit is formed having a suitable gap between the electrodes to allow fill fluid to reside therebetween.

Electrical properties of the fill fluid are measured by an electrical diagnostic module 42 connected to electrodes 38 and 40. These measurements may include measuring the resistivity or conductive properties of the fill fluid. Circuitry for measuring these properties are well known to those skilled in the art. Generally, the property to be measured will depend on the nature of the expected contaminants and the electrical characteristics of the fill fluid that is used.

If an electrical property of the fill fluid changes, which indicates that the fill fluid is contaminated, the electrical diagnostic module 42 measures the change and notifies a user via an indicator 44 that the measurements of the transmitter are unreliable. Indicator 44 may simply be an alarm or light for providing a warning to an operator that an electrical property of the fill fluid has changed beyond a selected minimum that would normally be expected and the measurement made by the transmitter may be doubtful.

While it may be more economical to place the pair of interdigitated electrodes 38, 40 on the sensor package 34, they can be placed anywhere in the sealed environment. For example, it may be desirable to place the electrodes near the welds of the diaphragms. This may provide an earlier detection of the contamination. Further, the concept of this invention is not limited to the use of interdigitated electrodes for detecting changes in the electrical property of the fill fluid. The housing could serve as an electrical ground and a conductive probe could be disposed in the fill fluid.

While the invention has been particularly shown and described with reference to preferred embodiments thereof, it will be understood by those skilled in the art that various changes in form and details may be made therein without departing from the spirit and scope of the invention, as defined by the appended claims. For example, the operations of both the diagnostic module 42 and the indicator 44 may be incorporated into the operations of a cpu used to validate signals generated by the sensor element 32. Further, threshold values could be established for changes in the electrical properties of the fill fluid to account for changes that would ordinarily occur as a result of changes, such as temperature changes, in the the process environment to avoid tripping an alarm unnecessarily. Also, the term non-conducting fluids extends to gases, liquids, solid particulates and mixtures of same. For example, process temperatures are commonly measured with sensing elements in a metal probe that is filled with alumina powder to maintain good thermal contact between the element and the metal probe. Penetration of the metal probe by process fluids would be detected by a pair of electrodes placed within the probe using the concepts of this invention.

I claim:

1. In a pressure sensing device having a differential pressure sensor mounted on an insulating substrate and in fluid communication with a sealed enclosure filled with electrically non-conductive fill fluid that couples to said pressure sensor a pressure condition external to said sealed enclosure, the improvement comprising at least two electrodes mounted on said insulating substrate for disposition with said pressure sensor in said sealed enclosure, said electrodes being arranged in relation to one another so as to allow fill fluid to reside therebetween, monitoring means disposed external to said sealed enclosure and electrically connected to said electrodes for monitoring an electrical property of said fill fluid, and indicating means electrically connected to said monitoring means for indicating changes in the monitored electrical property of said fill fluid, thereby to report changes in the coupling by said fill fluid of a pressure condition to said pressure sensor.

2. In a pressure sensing device as set forth in claim 1, and having two sealed enclosures in fluid communication with said pressure sensor, the further improvement comprising at least two electrodes disposed in each of said two enclosures and electrically connected with said monitoring means.

3. In a pressure sensing device as set forth in claim 1, the further improvement wherein said electrodes are mounted on said insulating substrate by plating.

4. In a pressure sensing device as set forth in claim 1, the further improvement wherein said electrodes are mounted on said insulating substrate by thin-film metallization.

5. In a pressure sensing device as set forth in claim 1, the further improvement wherein said electrodes are mounted on said insulating substrate by thick-film metallization.

* * * * *